(12) United States Patent
Liu

(10) Patent No.: US 8,456,821 B2
(45) Date of Patent: Jun. 4, 2013

(54) SERVER

(75) Inventor: Lei Liu, Shenzhen (CN)

(73) Assignees: Hong Fu Jin Precision Industry (ShenZhen) Co., Ltd., Shenzhen (TW); Hon Hai Precision Industry Co., Ltd., New Taipei (TW)

( * ) Notice: Subject to any disclaimer, the term of this patent is extended or adjusted under 35 U.S.C. 154(b) by 311 days.

(21) Appl. No.: 12/955,912

(22) Filed: Nov. 30, 2010

(65) Prior Publication Data

US 2012/0120579 A1    May 17, 2012

(30) Foreign Application Priority Data

Nov. 17, 2010   (CN) .......................... 2010 1 0547946

(51) Int. Cl.
*G06F 1/16*   (2006.01)
(52) U.S. Cl.
USPC ...... 361/679.08; 345/163; 248/422; 455/466; 341/31
(58) Field of Classification Search
USPC ...................... 211/26; 345/168, 173, 184, 1.1, 345/1.3, 30, 501, 905, 169, 156, 163, 170; 361/679.01, 679.27, 679.09, 679.23, 679.29, 361/679.41, 679.43, 679.45, 679.56, 679.07, 361/679.58, 679.12, 679.26, 679.55, 679.04, 361/679.11, 679.3, 679.17; 248/118.5, 918, 248/551, 371, 125.1, 422; 348/143, 158; 455/414.1, 41.2, 456.1, 41.1, 566, 404.1, 455/567, 401, 466, 426.1; 341/20, 22, 24, 341/23, 31

See application file for complete search history.

(56) References Cited

U.S. PATENT DOCUMENTS

| 2006/0227111 A1* | 10/2006 | Chou ............................. 345/168 |
| 2006/0289370 A1* | 12/2006 | Shih ................................. 211/26 |
| 2007/0195496 A1* | 8/2007 | Wu et al. ......................... 361/683 |

* cited by examiner

*Primary Examiner* — Hung Duong
(74) *Attorney, Agent, or Firm* — Altis Law Group, Inc.

(57) ABSTRACT

A server includes two opposite brackets and a keyboard module. The keyboard module includes a supporting board fixed between the brackets and a keyboard slidably mounted on the supporting board.

10 Claims, 4 Drawing Sheets

SERVER

BACKGROUND

1. Technical Field

The present disclosure relates to servers, and more particularly to a server having a keyboard module.

2. Description of Related Art

With the development of servers, the application range of the servers is becoming ever greater. When a server needs to be tested or programmed, a keyboard will be attached and used. However, it is inconvenient and cumbersome to attach and use a separate keyboard.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
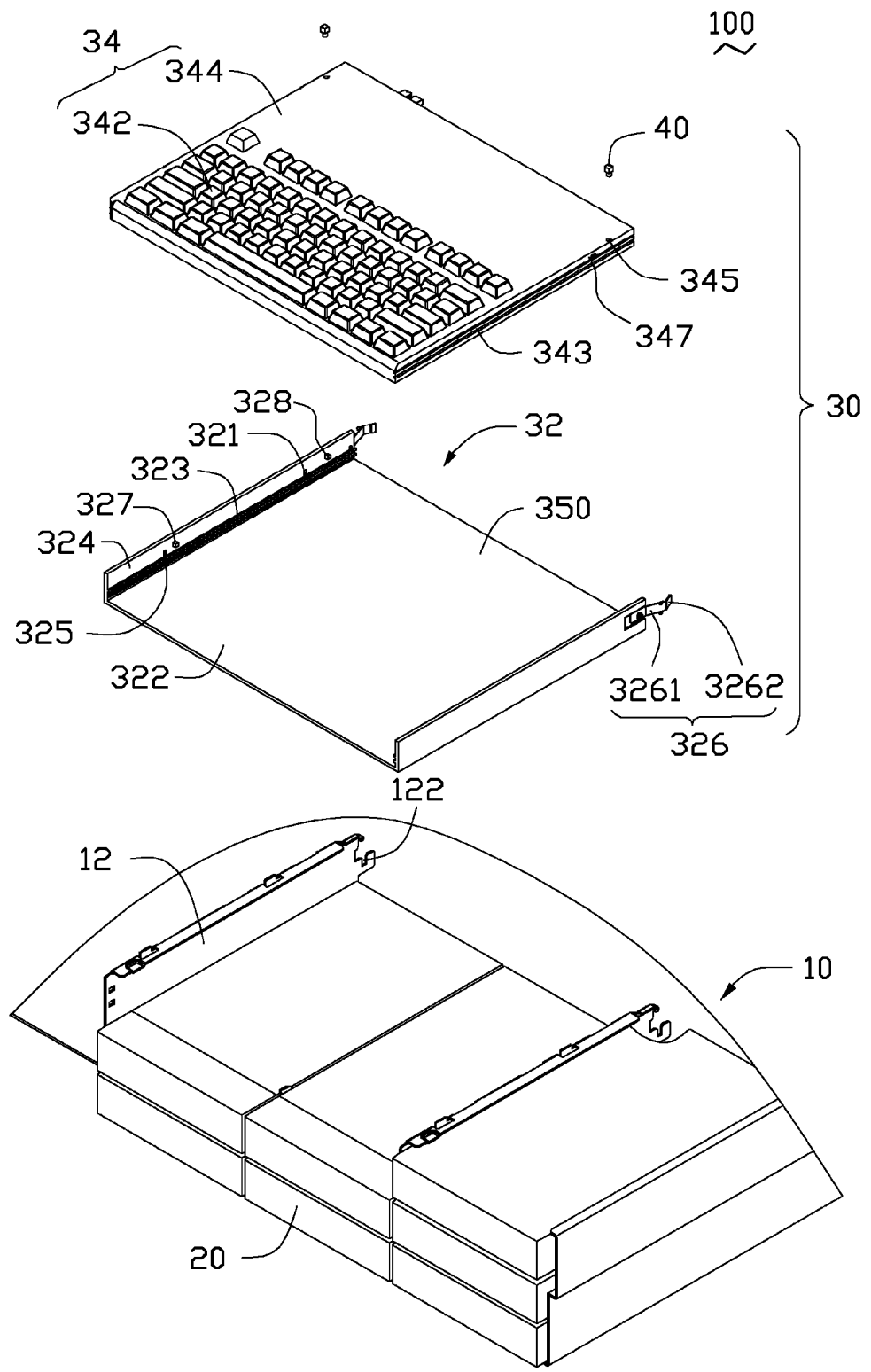
FIG. 1 is a partial, exploded, and isometric view of an exemplary embodiment of a server; the server includes a keyboard module.

Referring to FIG. 1, an exemplary embodiment of a server 100 includes a server enclosure 10. The enclosure 10 includes a plurality of hard disk drives (HDDs) 20, and a built-in keyboard module 30.

The server enclosure 10 includes two parallel brackets 12 configured to receive the HDDs 20, and the keyboard module 30. A cutout 122 is defined in a back end of each bracket 12.

The keyboard module 30 includes a supporting board 32 and a keyboard 34 slidably mounted to the supporting board 32. The supporting board 32 includes a bottom board 322, two sidewalls 324 substantially perpendicularly extending up from opposite sides of the bottom board 322, and two fixing elements 326. A receiving space 350 is bounded by the bottom board 322 and the sidewalls 324. Two beams 323 are attached on an inner surface of each sidewall 324. First and second blocks 327 and 328 extend from each sidewall 324 toward the other sidewall 324, above the beams 323. First and second slots 325 and 321 are defined in each sidewall 324.

Each fixing element 326 includes a fixing portion 3261 and a latching portion 3262 slantingly extending from a first end of the fixing portion 3261. A second end of the fixing portion 3261 is fixed on an outer surface of a back end of the corresponding sidewall 324. The latching portion 3262 is used to latch with the cutout 122 of the bracket 12 to fix the keyboard module 30 in the server enclosure 10.

The keyboard 34 includes a key area 342 and an idle area 344. Two grooves 343, corresponding to the beams 323, are defined in opposite lateral surfaces of the keyboard 34. Two holes 345 are defined in two sides of a top surface of the idle area 344. Two elastic elements 347 are mounted on the lateral surfaces of the keyboard 34 to be engaged in the first and second slots 325 and 321, to position the keyboard 34.

Figure 2:
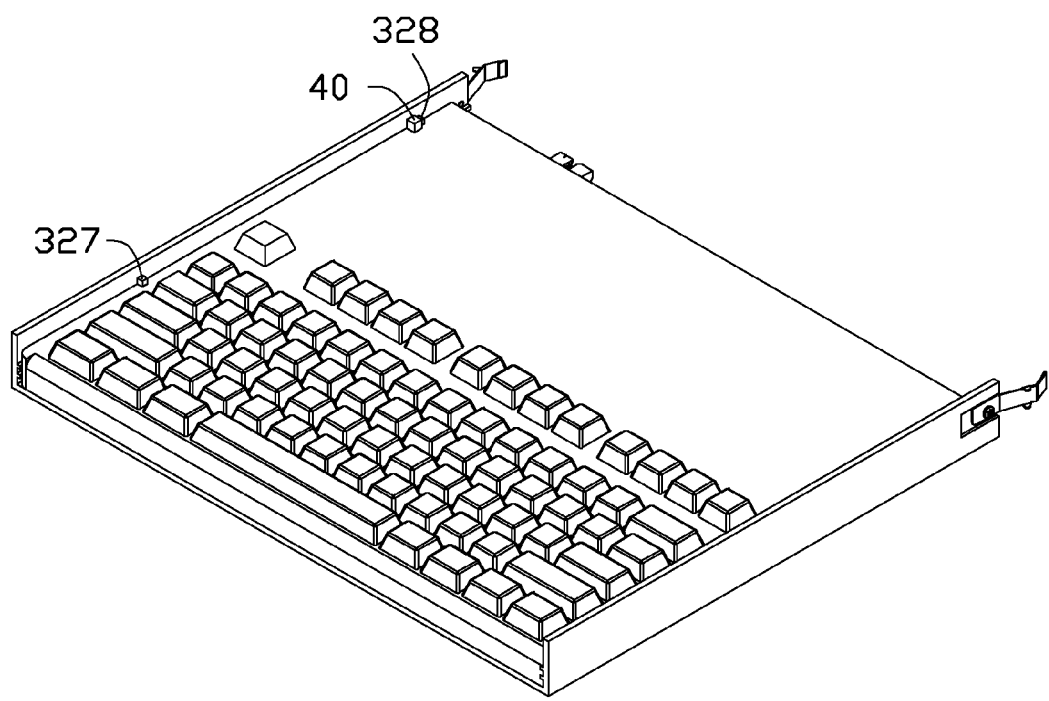
FIG. 2 is an assembled, isometric view of the keyboard module of FIG. 1.

Referring to FIG. 2, in assembling the keyboard module 30, the keyboard 34 is slid into the receiving space 350, with the beams 323 engaged in the corresponding grooves 343. Two positioning pins 40 are engaged in the holes 345.

Figure 3:
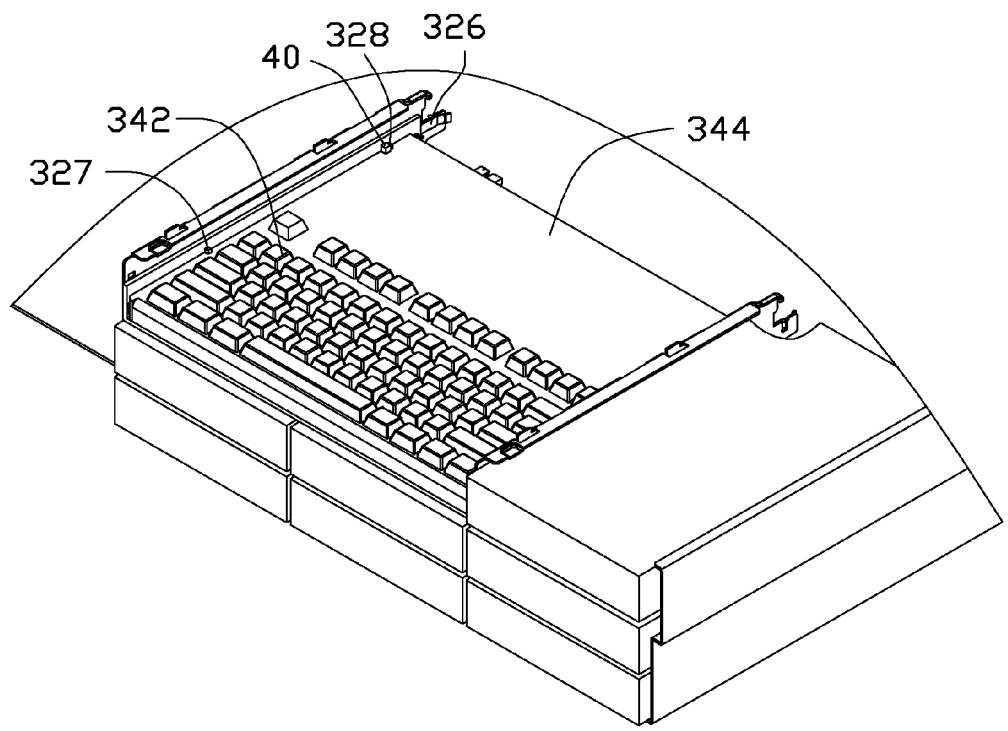
FIG. 3 is an assembled, isometric view of the server of FIG. 1.
Figure 4:
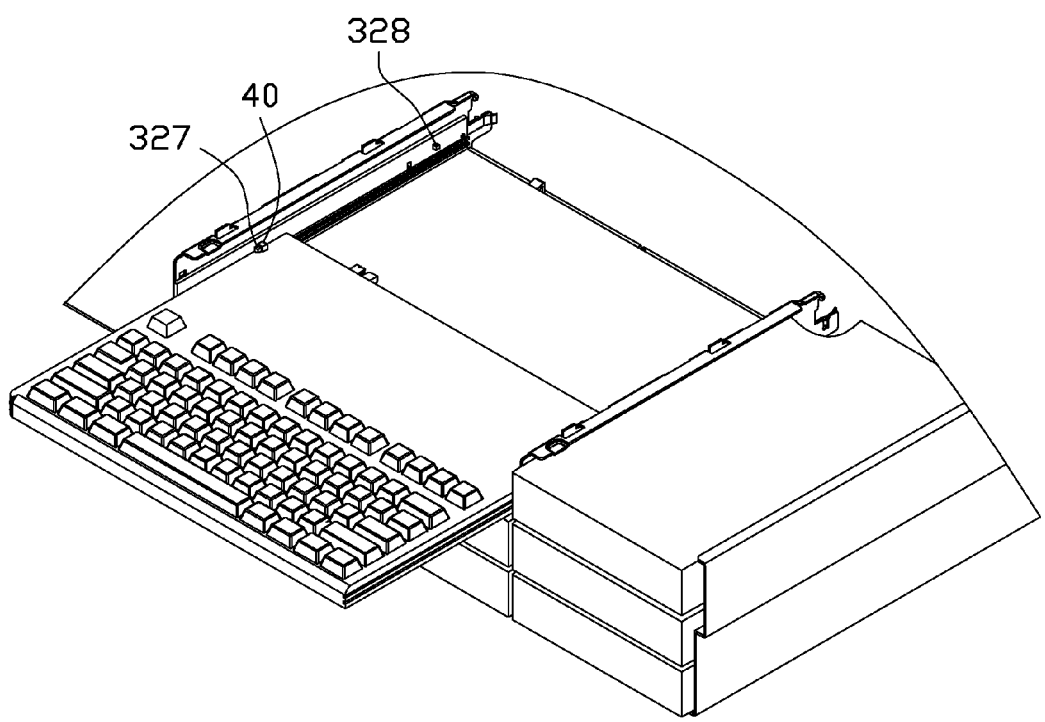
FIG. 4 is a schematic view of the keyboard module sliding out of the server of FIG. 1.

Referring to FIGS. 3 and 4, in assembling the keyboard module 30 in the server enclosure 10, the keyboard module 30 is slid into the server enclosure 10. The latching portions 3262 of the keyboard element 30 are latched in the cutouts 122 of the brackets 12. Signal lines and power lines of the keyboard 34 are connected to corresponding signal terminals and power terminals of a circuit board of the server enclosure 10.

When the keyboard 34 is not in use it is completely received in the receiving space 350, and the second blocks 328 block the corresponding positioning pins 40. The elastic elements 347 of the keyboard 34 are engaged in the second slots 321 of the sidewalls 324 to position the keyboard 34 on a first position of the supporting board 32 (see FIG. 3). To use the keyboard 34, the keyboard 34 is drawn out of the supporting board 32. The elastic elements 347 are deformed and slid out of the second slots 321, to slide along the lateral surfaces of the keyboard 34 until sliding into the first slots 325. Therefore the keyboard 34 is positioned on a second position of the supporting board 32 and the whole of the key area 342 of the keyboard 34 is exposed out of the server enclosure 10, and the positioning pins 40 are blocked by the first blocks 327.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A server comprising:
   two opposite brackets; and
   a keyboard module comprising:
      a supporting board mounted between the brackets; and
      a keyboard slidably mounted on the supporting board;
   wherein the supporting board comprises a bottom board, two sidewalls extending up from opposite sides of the bottom board, and two fixing elements to fix the supporting board to the brackets, a receiving space is bounded by the bottom board and the sidewalls to receive the keyboard, first and second blocks extend from each sidewall toward the other sidewall, a positioning pin is secured to each side of a top surface of the keyboard; when the keyboard is received in the receiving space, the positioning pins is blocked by the second blocks; and when the keyboard is drawn out from the supporting board, the positioning pins are blocked by the first blocks.

2. The server of claim 1, wherein a cutout is defined in a back end of each bracket, each fixing element comprises a fixing portion fixed on the corresponding sidewall, and a latching portion latched in the corresponding cutouts of the brackets.

3. The server of claim 1, wherein two beams are mounted on inner sides of the sidewalls, two grooves, corresponding to the beams, are defined in two lateral surfaces of the keyboard.

4. The server of claim 1, wherein first and second slots are defined in each sidewall, an elastic element is formed on each lateral surface of the keyboard, wherein when the keyboard is received in the receiving space, the elastic elements are engaged in the first slots to position the keyboard in a first position, when the keyboard is drawn out from the supporting board, the elastic elements are engaged in the second slots to position the keyboard in a second position.

5. A server comprising:
   two opposite brackets;
   a plurality of hard disk drives (HDDs) fixed between the brackets, with a space bounded by the plurality HDDs and the brackets; and
   a keyboard module received in the idle HDD space, the keyboard module comprising:
   a supporting board fixed between the brackets in the idle HDD space; and
   a keyboard slidably mounted on the supporting board.

6. The server of claim 5, wherein the supporting board comprises a bottom board, two sidewalls extending up from opposite sides of the bottom board, and two fixing elements to fix the supporting board to the brackets, a receiving space is bounded by the bottom board and the sidewalls to receive the keyboard.

7. The server of claim 6, wherein two cutouts are defined in back ends of the brackets, each fixing element comprises a fixing portion fixed on a corresponding sidewall, and a latching portion latched in the cutout of a corresponding bracket.

8. The server of claim 6, wherein two beams are mounted on inner sides of the sidewalls, two grooves, corresponding to the beams, are defined in opposite lateral surfaces of the keyboard.

9. The server of claim 6, wherein first and second blocks extend from each sidewall toward the other sidewall, two positioning pins extend up from opposite sides of a top surface of the keyboard, wherein when the keyboard is received in the receiving space, the positioning pins are blocked by the first blocks, when the keyboard is drawn out of the supporting board, the positioning pins are blocked by the second blocks.

10. The server of claim 9, wherein first and second slots are defined in each sidewall of the supporting board, two elastic elements extend from the lateral surfaces of the keyboard, when the keyboard is received in the receiving space, the elastic elements are engaged in the first slots to position the keyboard in a first position, when the keyboard is drawn out of the supporting board, the elastic elements are engaged in the second slots to position the keyboard in a second position.

* * * * *